United States Patent
Okumura et al.

(10) Patent No.: US 7,510,667 B2
(45) Date of Patent: Mar. 31, 2009

(54) PLASMA PROCESSING METHOD AND APPARATUS

(75) Inventors: Tomohiro Okumura, Kadoma (JP); Ichiro Nakayama, Kadoma (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 11/397,626

(22) Filed: Apr. 5, 2006

(65) Prior Publication Data
US 2006/0169673 A1   Aug. 3, 2006

Related U.S. Application Data

(62) Division of application No. 10/357,456, filed on Feb. 4, 2003, now abandoned.

(30) Foreign Application Priority Data

Feb. 6, 2002    (JP)    ............................. 2002-029232
Feb. 15, 2002   (JP)    ............................. 2002-038102

(51) Int. Cl.
    *C23F 1/00* (2006.01)
(52) U.S. Cl. ........................................................ 216/67
(58) Field of Classification Search ........................ None
    See application file for complete search history.

(56) References Cited

U.S. PATENT DOCUMENTS

| | | | |
|---|---|---|---|
| 5,558,722 A | | 9/1996 | Okumura et al. |
| 5,846,885 A | * | 12/1998 | Kamata et al. ............... 438/729 |
| 6,093,457 A | * | 7/2000 | Okumura et al. ............ 427/569 |
| 6,132,566 A | * | 10/2000 | Hofmann et al. ....... 204/192.17 |
| 6,165,311 A | | 12/2000 | Collins et al. |
| 6,171,438 B1 | | 1/2001 | Masuda et al. |
| 6,231,725 B1 | * | 5/2001 | Nulman et al. .......... 204/192.12 |
| 6,238,528 B1 | * | 5/2001 | Xu et al. ................. 204/192.12 |
| 6,245,202 B1 | | 6/2001 | Edamura et al. |
| 6,252,354 B1 | * | 6/2001 | Collins et al. ........... 315/111.51 |
| 6,270,687 B1 | * | 8/2001 | Ye et al. ........................ 216/68 |
| 6,346,915 B1 | | 2/2002 | Okumura et al. |
| 6,355,573 B1 | * | 3/2002 | Okumura et al. ............ 438/709 |
| 6,422,173 B1 | * | 7/2002 | Nakajima ................. 118/723 I |
| 6,545,420 B1 | * | 4/2003 | Collins et al. ........... 315/111.51 |
| 2001/0021422 A1 | * | 9/2001 | Yamakoshi et al. .......... 427/569 |
| 2002/0160124 A1 | * | 10/2002 | Murayama et al. .......... 427/569 |

(Continued)

FOREIGN PATENT DOCUMENTS

EP    0 648 069    4/1995

(Continued)

*Primary Examiner*—Allan Olsen
(74) *Attorney, Agent, or Firm*—Wenderoth, Lind & Ponack, L.L.P.

(57) ABSTRACT

A plasma processing apparatus includes a vacuum vessel, a substrate electrode for supporting a substrate, and an antenna disposed in opposition to the substrate electrode and covered with an insulating antenna cover. A first high-frequency power supplies a high-frequency power of a 30 MHz to 3 GHz frequency to the antenna, and a second high-frequency power supply supplies a high-frequency power of a 100 kHz to 20 MHz. A refrigerant supply unit is provided for supplying a refrigerant flow to the antenna, and an electrically conductive sheet is provided between the antenna and the antenna cover. The electrically conductive sheet has a surface that is parallel to the substrate electrode and is larger than an opposing surface of the antenna.

6 Claims, 7 Drawing Sheets

U.S. PATENT DOCUMENTS

| | | |
|---|---|---|
| 2003/0006019 A1* | 1/2003 | Johnson et al. ............... 164/1 |
| 2003/0022519 A1* | 1/2003 | Fujioka et al. .............. 438/758 |
| 2003/0049558 A1* | 3/2003 | Aoki et al. ................. 430/128 |
| 2004/0079733 A1* | 4/2004 | Kawaguchi et al. .... 219/121.36 |
| 2005/0186801 A1* | 8/2005 | Uno et al. .................. 438/706 |
| 2006/0048894 A1* | 3/2006 | Yamazaki et al. ...... 156/345.45 |

FOREIGN PATENT DOCUMENTS

| | | |
|---|---|---|
| JP | 7-245295 | 9/1995 |
| JP | 7-263361 | 10/1995 |
| JP | 7-297175 | 11/1995 |
| JP | 7-302786 | 11/1995 |
| JP | 7-321097 | 12/1995 |
| JP | 7-331445 | 12/1995 |
| KR | 1995-0005121 | 2/1995 |
| TW | 296535 | 1/1997 |
| TW | 329018 | 4/1998 |
| WO | 98/00859 | 1/1998 |

\* cited by examiner

PLASMA PROCESSING METHOD AND APPARATUS

This is a divisional application of Ser. No. 10/357,456, filed Feb. 4, 2003 now abandoned.

BACKGROUND OF THE INVENTION

The present invention relates to a plasma processing method and apparatus to be used for the manufacture of semiconductor or other electron devices and micromachines.

In the manufacture of semiconductor or other electron devices and micromachines, thin-film processing techniques using plasma processing have become increasingly important in recent years.

As an example of conventional plasma processing methods, plasma processing using a patch-antenna type plasma source is described below with reference to FIG. 3. Referring to FIG. 3, while the interior of a vacuum vessel 51 is maintained at a specified pressure by introducing a specified gas from a gas supply unit 52 into the vacuum vessel 51 and simultaneously performing exhaustion by a turbo-molecular pump 53 as an exhausting unit, a high-frequency power of 100 MHz is supplied by an antenna use high-frequency power supply 54 to an antenna 55 provided so as to project into the vacuum vessel 51. Then, plasma is generated in the vacuum vessel 51, allowing plasma processing to be carried out with a substrate 57 placed on a substrate electrode 56.

There is also provided a substrate-electrode use high-frequency power supply 58 for supplying high-frequency power to the substrate electrode 56, making it possible to control ion energy that reaches the substrate 57. The high-frequency power supplied to the antenna 45 is fed to a proximity of the center of the antenna 55 via an antenna-use matching circuit 59 by a feed bar 60. A dielectric plate 61 is sandwiched between the antenna 55 and the vacuum vessel 51, and the feed bar 60 serves to connect the antenna 55 and the antenna-use high-frequency power supply 54 to each other via a through hole provided in the dielectric plate 61. Also, the surface of the antenna 55 is covered with an antenna cover 65.

Further, a slit 64 is provided so as to comprise a groove-shaped space between the dielectric plate 61 and a dielectric ring 62 provided at a peripheral portion of the dielectric plate 61, and a groove-shaped space between the antenna 55 and a conductor ring 63 provided at a peripheral portion of the antenna 55.

The turbo-molecular pump 53 and an exhaust port 73 are disposed just under the substrate electrode 56, and a pressure-regulating valve 74 for controlling the vacuum vessel 51 to a specified pressure is an up-and-down valve disposed just under the substrate electrode 56 and just over the turbo-molecular pump 53. The substrate electrode 56 is fixed to the vacuum vessel 51 with four pillars 75.

In the plasma processing described in the prior-art example, however, etching a high melting metal film formed on the substrate 57 would involve deposition of an electrically conductive deposited film on the antenna cover 65, in which case poor close-contactability of the conductive deposited film or occurrence of abnormal discharge at the surface of the antenna cover 65 would make it more likely to occur that the conductive deposited film would be peeled off, falling onto the substrate 57 as dust in some cases. According to a result of the present inventors' experiments, when the substrate 57 coated with a 200 nm thick iridium film was etched to a quantity of 7 pieces, 1000 or more dust particles having 0.23 µm or larger particle diameters were generated on the substrate 57.

Further, in the plasma processing described in the prior-art example, there is another issue that the temperature of the antenna cover 65 increases due to plasma exposure. Since the antenna cover 65 and the antenna 55 are vacuum-insulated from each other, the temperature of the antenna cover 65 gradually increases over repeated plasma processing. According to a result of the present inventors' experiments, it was found that the temperature of the antenna cover 65 increases up to 170° C. after 5-min. plasma processing and 1-min. vacuum holding is repeated six times. Such an abrupt change in the temperature of the antenna cover 65 may cause not only occurrence of dust but also cracks of the antenna cover 65.

In view of these and other prior-art issues, an object of the present invention is to provide a plasma processing method and apparatus which is less susceptible to the occurrence of dust and cracks of the antenna cover.

SUMMARY OF THE INVENTION

In order to achieve the above object, the present invention has the following constitution.

According to a first aspect of the present invention, there is provided a plasma processing method for generating plasma in a vacuum vessel, by supplying a high-frequency power of a 30 MHz to 3 GHz frequency to an antenna provided within the vacuum vessel in opposition to a substrate placed on a substrate electrode within the vacuum vessel while the interior of the vacuum vessel is controlled to a specified pressure by supplying gas into the vacuum vessel and simultaneously exhausting the interior of the vacuum vessel, and thus processing a high melting metal (high melting temperature metal) film formed on the substrate.

The method additionally includes supplying a high-frequency power of a 100 kHz to 20 MHz frequency different from the above frequency to the antenna to process the substrate.

According to a second aspect of the present invention, there is provided the plasma processing method according to the first aspect, wherein the high melting metal film is a film containing at least one element selected from among iridium, rhodium, ruthenium, platinum, gold, copper, rhenium, bismuth, strontium, barium, zirconium, lead, and niobium.

According to a third aspect of the present invention, there is provided the plasma processing method according to the first aspect, wherein the substrate is processed with temperature of the antenna controlled by giving a flow of a refrigerant to the antenna while heat conduction between the antenna and an antenna cover is ensured by an electrically conductive sheet which is disposed between the antenna and the antenna cover and whose surface parallel to the substrate is larger in surface area than that of the antenna, and further the substrate is processed while a self-bias voltage is generated up to an end portion of the cover by additionally supplying the high-frequency power of the 100 kHz to 20 MHz frequency different from the above frequency to the antenna.

According to a fourth aspect of the present invention, there is provided the plasma processing method according to the third aspect, wherein the plasma processing is an etching process of the high melting metal film formed on the substrate.

According to a fifth aspect of the present invention, there is provided the plasma processing method according to the fourth aspect wherein the high melting metal film is a film containing at least one element selected from among iridium, rhodium, ruthenium, platinum, gold, copper, rhenium, bismuth, strontium, barium, zirconium, lead, and niobium.

According to a sixth aspect of the present invention, there is provided a plasma processing apparatus comprising:

a vacuum vessel;

a gas supply unit for supplying gas into the vacuum vessel;

an exhausting unit for exhausting interior of the vacuum vessel;

a pressure-regulating valve for controlling the interior of the vacuum vessel to a specified pressure;

a substrate electrode for placing thereon a substrate within the vacuum vessel;

an antenna provided in opposition to the substrate electrode and covered with an insulating antenna cover;

a first high-frequency power supply capable of supplying a high-frequency power of a 30 MHz to 3 GHz frequency to the antenna;

a second high-frequency power supply capable of additionally supplying a high-frequency power of a 100 kHz to 20 MHz frequency different from the above frequency to the antenna;

a refrigerant supply unit for making a refrigerant flow to the antenna; and an electrically conductive sheet whose surface parallel to the substrate is larger than that of the antenna and which is provided between the antenna and the antenna cover.

According to a seventh aspect of the present invention, there is provided the plasma processing apparatus according to the sixth aspect, wherein the antenna cover is made of quartz glass.

According to an eighth aspect of the present invention, there is provided the plasma processing apparatus according to the sixth aspect, wherein the antenna cover is made of insulative silicon.

According to a ninth aspect of the present invention, there is provided the plasma processing apparatus according to the sixth aspect, wherein the antenna cover is 1 mm to 10 mm thick.

According to a 10th aspect of the present invention, there is provided the plasma processing apparatus according to the sixth aspect, wherein the electrically conductive sheet is made of a material having a resistivity of not more than 10 $\Omega \cdot m$.

According to an 11th aspect of the present invention, there is provided the plasma processing apparatus according to the sixth aspect, wherein the electrically conductive sheet is 0.03 mm to 3 mm thick.

According to a 12th aspect of the present invention, there is provided a plasma processing method for generating inductive-coupling type plasma in a vacuum vessel by placing a substrate on a substrate electrode within the vacuum vessel, supplying a first high-frequency power of a 1 MHz to 60 MHz frequency to a feeding point which is one end of a coil provided in opposition to the substrate electrode while interior of the vacuum vessel is controlled to a specified pressure by supplying gas into the vacuum vessel and simultaneously exhausting the interior of the vacuum vessel, and thus processing the substrate or a film formed on the substrate.

The method includes processing the substrate while supplying a second high-frequency power of a frequency lower than that of the first high-frequency power to the coil with the other end of the coil grounded via a capacitor.

According to a 13th aspect of the present invention, there is provided a plasma processing method for generating inductive-coupling type plasma in a vacuum vessel by placing a substrate on a substrate electrode within the vacuum vessel, supplying a first high-frequency power of a 1 MHz to 60 MHz frequency to a feeding point which is one end of a coil provided in opposition to the substrate electrode while interior of the vacuum vessel is controlled to a specified pressure by supplying gas into the vacuum vessel and simultaneously exhausting the interior of the vacuum vessel, and thus processing the substrate or a film formed on the substrate, the method comprising:

The method includes processing the substrate while supplying a second high-frequency power of a frequency lower than that of the first high-frequency power to an electrode provided at a vacancy of the coil.

According to a 14th aspect of the present invention, there is provided the plasma processing method according to the 12th aspect, wherein the plasma processing is an etching process of a high melting metal film formed on the substrate.

According to a 15th aspect of the present invention, there is provided the plasma processing method according to the 14th aspect, wherein the high melting metal film is a film containing at least one element selected from among iridium, rhodium, ruthenium, platinum, gold, copper, rhenium, bismuth, strontium, barium, zirconium, lead, and niobium.

According to a 16th aspect of the present invention, there is provided a plasma processing apparatus comprising:

a vacuum vessel;

a gas supply unit for supplying gas into the vacuum vessel;

an exhausting unit for exhausting interior of the vacuum vessel;

a pressure-regulating valve for controlling the interior of the vacuum vessel to a specified pressure;

a substrate electrode for placing thereon a substrate within the vacuum vessel;

a coil provided in opposition to the substrate electrode and having one end grounded via a capacitor;

a first high-frequency power supply for supplying a first high-frequency power of a 1 MHz to 60 MHz frequency to a feeding point which is the other end of the coil; and a second high-frequency power supply for supplying a second high-frequency power of a frequency lower than that of the first high-frequency power to the coil.

According to a 17th aspect of the present invention, there is provided a plasma processing apparatus comprising:

a vacuum vessel;

a gas supply unit for supplying gas into the vacuum vessel;

an exhausting unit for exhausting interior of the vacuum vessel;

a pressure-regulating valve for controlling the interior of the vacuum vessel to a specified pressure;

a substrate electrode for placing thereon a substrate within the vacuum vessel;

a coil provided in opposition to the substrate electrode;

first high-frequency power supply for supplying a first high-frequency power of a 1 MHz to 60 MHz frequency to a feeding point which is one end of the coil; and a second high-frequency power supply for supplying a second high-frequency power of a frequency lower than that of the first high-frequency power to an electrode provided at a vacancy of the coil.

BRIEF DESCRIPTION OF THE DRAWINGS

These and other aspects and features of the present invention will become clear from the following description taken in conjunction with the preferred embodiments thereof with reference to the accompanying drawings, in which:

FIG. 5 is a perspective view showing a construction of a plasma processing apparatus used in a fourth embodiment of the present invention, as it is seen through;

FIG. 7 is a perspective view showing a construction of a plasma processing apparatus used in a sixth embodiment of the present invention, as it is seen through;

FIG. 8 is a perspective view showing a construction of a plasma processing apparatus used in a seventh embodiment of the present invention, as it is seen through;

DETAILED DESCRIPTION OF THE PREFERRED EMBODIMENTS

Figure 1:
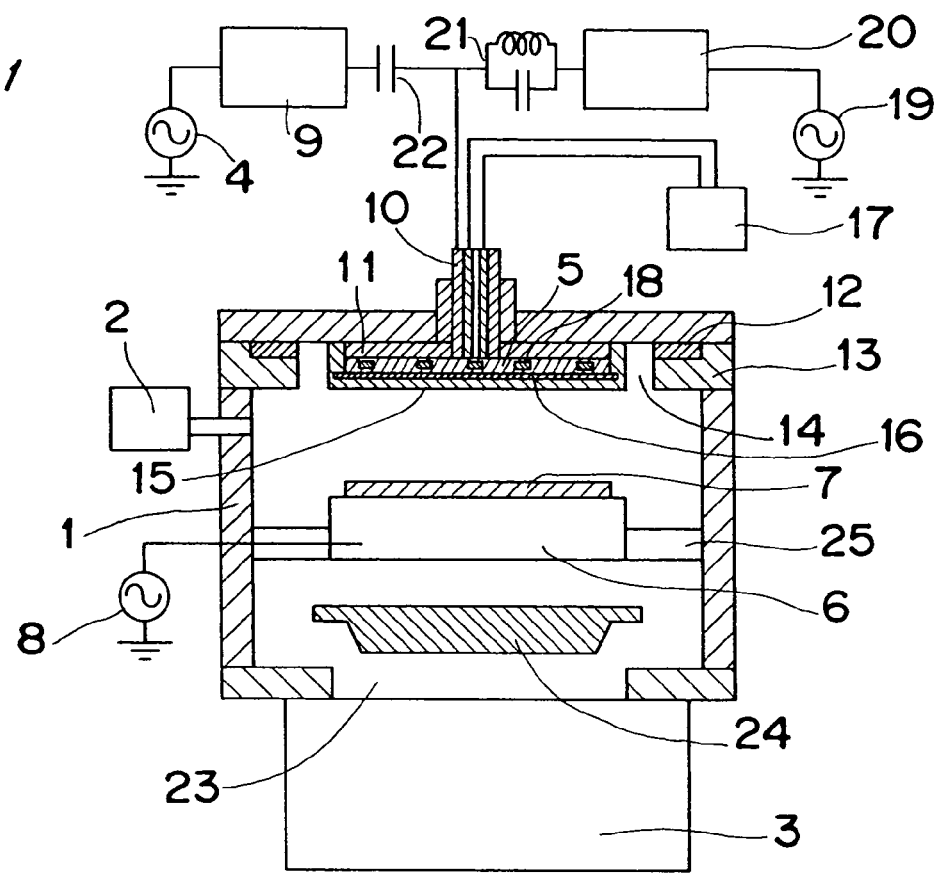
FIG. 1 is a sectional view showing a construction of a plasma processing apparatus used in a first embodiment of the present invention.

Before the description of the present invention proceeds, it is to be noted that like parts are designated by like reference numerals throughout the accompanying drawings.

Hereinbelow, embodiments of the present invention will be described in detail with reference to the accompanying drawings.

A plasma processing method and apparatus according to a first embodiment of the present invention is described below with reference to FIG. 1.

FIG. 1 is a sectional view of the plasma processing apparatus with a patch antenna type plasma source mounted thereon, which is used in the first embodiment of the present invention. Referring to FIG. 1, while the interior of a vacuum vessel 1 is maintained at a specified pressure by introducing a specified gas from a gas supply unit 2 into the vacuum vessel 1 serving as one example of a vacuum chamber and simultaneously performing exhaustion by a turbo-molecular pump 3 as an exhausting unit, a high-frequency power of a 100 MHz frequency is supplied by an antenna use high-frequency power supply 4 to an antenna 5. As a result of this, plasma is generated in the vacuum vessel 1, thereby allowing plasma processing to be carried out on a substrate 7 placed on a substrate electrode 6.

There is also provided a substrate-electrode use high-frequency power supply 8 for supplying high-frequency power of 400 kHz to the substrate electrode 6, thereby making it possible to control the ion energy that reaches the substrate 7. The high-frequency power supplied to the antenna 5 is fed to a proximity of the center of the antenna 5 by a feed bar 10 via an antenna-use matching circuit 9. A dielectric plate 11 composed of a dielectric material is sandwiched between the antenna 5 and the vacuum vessel 1, and the feed bar 10 extends through a through hole provided in the dielectric plate 11 in order to be brought into contact with the antenna 5.

Further, a slit 14 is provided so as to comprise a groove-shaped space between the dielectric plate 11 and a dielectric ring 12 provided at a peripheral portion of the dielectric plate 11, and a ring-shaped and groove-shaped space between the antenna 5 and a conductor ring 13 provided at a peripheral portion of the antenna 5. An inner side face of the slit 14 and the antenna 5 are covered with a 5 mm thick antenna cover 15 made of quartz glass. An electrically conductive sheet 16, whose surface parallel to the substrate 7 is larger than the antenna 5 is provided between the antenna 5, and the antenna cover 15. The conductive sheet 16 is 1 mm thick. Also, a refrigerant feed apparatus 17 for making a refrigerant flow to the antenna 5 is provided, and a refrigerant flow passage 18 is formed inside the antenna 5, while an inlet/outlet passage for the refrigerant is provided within the feed bar 10.

A high-frequency power of a 500 kHz frequency is supplied to the antenna 5 from a self-bias generation use high-frequency power supply 19 via a self-bias use matching circuit 20. A 100 MHz trap (trap circuit) 21 is provided to prevent the high-frequency power of a 100 MHz frequency for use of plasma generation from mixing into the self-bias use matching circuit 20, and further, a high-pass filter 22 is provided to prevent the 500 kHz high-frequency power from mixing into the antenna-use matching circuit 9 for use of plasma generation.

The turbo-molecular pump 3 and an exhaust port 23 are disposed just under the substrate electrode 6, and a pressure-regulating valve 24 for controlling the vacuum vessel 1 to a specified pressure is an up-and-down valve disposed just under the substrate electrode 6 and just over the turbo-molecular pump 3. The substrate electrode 6 is fixed to the vacuum vessel 1 with four pillars 25.

With the plasma processing apparatus of the above-described construction, as one example, the substrate 7 coated with a 200 nm thick iridium film was etched to a quantity of 100 pieces under the conditions that while the internal pressure of the vacuum vessel 1 was maintained at 0.5 Pa by supplying 145 sccm of argon gas and 15 sccm of chlorine gas into the vacuum vessel 1, 1500 W of a 100 MHz high-frequency power for plasma generation and 500 W of a 500 kHz high-frequency power for self-bias generation were supplied to the antenna 5, and simultaneously 400 W of a 400 kHz high-frequency power was supplied to the substrate electrode 6. As a result of this, only 50 or less dust particles having 0.23 µm or larger particle diameters were generated on the substrate 7, which led to a dramatic improvement over the prior art in terms of the quantity of substrates that can be continuously processed without performing wet maintenance of the vacuum vessel 1.

This can be attributed to the fact that generating a self-bias voltage in the antenna cover 15 made it possible to efficiently prevent any deposition of a conductive deposited film on the antenna cover 15. In fact, examining the surface state of the antenna cover 15 after a 100-piece etching process of the substrate 7 coated with an iridium film showed no formation of any conductive deposited film. Also, since the size of the surface of the antenna 5 parallel to the substrate 7 is quite smaller than the size of the surface of the antenna cover 15 parallel to the substrate 7, it would be considered difficult to generate a self-bias voltage up to end portions of the antenna cover 15. However, in the first embodiment, by virtue of the provision of the conductive sheet 16 whose surface parallel to the substrate 7 is larger than that of the antenna 5, the self-bias voltage was able to be generated up to the end portions of the antenna cover 15.

Further, when 5-min. plasma processing and 1-min. vacuum holding were repeated 100 times with the refrigerant temperature held at 25° C., the temperature of the antenna cover 15 was maintained at 100° C. or less. The reason for this can be considered that a thin conductive sheet 16 was interleaved between the antenna cover 15 and the antenna 5 and that the antenna 5 was cooled by a refrigerant. Whereas a carbon sheet (NICAFILM made by Nippon Carbon Co., Ltd.) was used as the conductive sheet 16 in this experiment, the conductive sheet 16 is soft, making close contact with the antenna 5 and the antenna cover 15, and thin, having a great effect in accelerating heat exchange between the antenna cover 15 and the antenna 5. As a result of carrying out plasma processing while the temperature of the antenna cover 15 was controlled as described above, there was no occurrence of cracks in the antenna cover 15.

The above-described first embodiment of the present invention has exemplified only a part of many variations of the configuration of the vacuum vessel, structure and arrangement of the plasma source, and the like out of the application range of the present invention. Needless to say, many other variations are conceivable in applying the present invention, other than the example given above.

Whereas the present invention has been exemplified by a case where the plasma processing is an etching of a substrate coated with an iridium film, the present invention is also applicable to other various etching processes or plasma CVD processes. However, the present invention is effective particularly for etching of high melting metal (high melting temperature metal) films, because the etching process of such films is accompanied with a higher likelihood that a conductive deposited film may be deposited on the antenna cover. The high melting metal film is not limited to iridium, and the present invention is particularly effective for the etching process of a film containing at least one element selected from among rhodium, ruthenium, platinum, gold, copper, rhenium, bismuth, strontium, barium, zirconium, lead, and niobium.

Whereas the present invention has been exemplified by a case where the antenna cover is given by 5 mm thick quartz glass, the antenna cover might also be given by other ceramic based materials or insulative silicon. However, ceramic based materials, which contain impurities in larger part, could represent a source of dust or contamination, hence are not preferable. Meanwhile, using insulative silicon produces an effect of improving the etching selection ratio in the etching process of insulating films such as silicon oxide or the like. Further, since too thin an antenna cover would cause an insufficiency of mechanical strength, and since too thick an antenna cover would cause the cooling efficiency to lower due to a heat storage effect, the antenna cover is, preferably, about 1 mm to 10 mm thick.

Whereas the present invention has been exemplified by a case where the conductive sheet is a uniform-in-thickness, 1 mm thick carbon sheet, thickness and material of the conductive sheet are not limited to these. It is preferable, however, that the thermal conductivity of the conductive sheet is not less than 0.1 W/m·K. The conductive sheet is desirably soft and highly close-contactable in order to fulfill the heat exchange between the antenna and the antenna cover, but too thin a conductive sheet would make it hard to absorb the insufficiency of planarity of the antenna or the antenna cover and too thick a conductive sheet would cause the conductive sheet itself to increase in heat capacity, thus the conductive sheet is preferably about 0.03 mm to 3 mm thick. Further, a larger resistivity of the conductive sheet would lead to the occurrence of loss due to an effect of the high-frequency power supplied to the antenna, which in some cases would lead to the occurrence of heat generation or melting of the sheet, thus the resistivity is desirably not more than 10 Ω·m.

Also, the above embodiment has been described in a case where the frequency of the high-frequency power for plasma generation applied to the antenna is 100 MHz. However, for the patch antenna used in the present invention, frequencies of 30 MHz to 3 GHz can be used.

Also, the above embodiment has been described on the basis of a case where the frequency of the self-bias use high-frequency power applied to the antenna is 500 kHz. However, high-frequency power of other frequencies, e.g. 100 kHz to 20 MHz, can be used. Nevertheless, in order to effectively generate the self-bias voltage to the antenna cover, it is preferable to use a high-frequency power of about 100 kHz to 1 MHz.

Also, the above embodiment has been described on the basis of a case where the frequency of the high-frequency power supplied to the substrate electrode is 400 kHz. However, it is needless to say that high-frequency power of other frequencies, e.g. 100 kHz to 100 MHz, can be used for the control of ion energy that reaches the substrate. Otherwise, without the supply of high-frequency power to the substrate electrode, it is also possible to carry out plasma processing with weak ion energy by making use of a slight difference between plasma potential and substrate potential. Furthermore, using a frequency different from the frequency of the self-bias use high-frequency power supplied to the antenna has an advantage that interference of high frequencies can be avoided.

Figure 2:
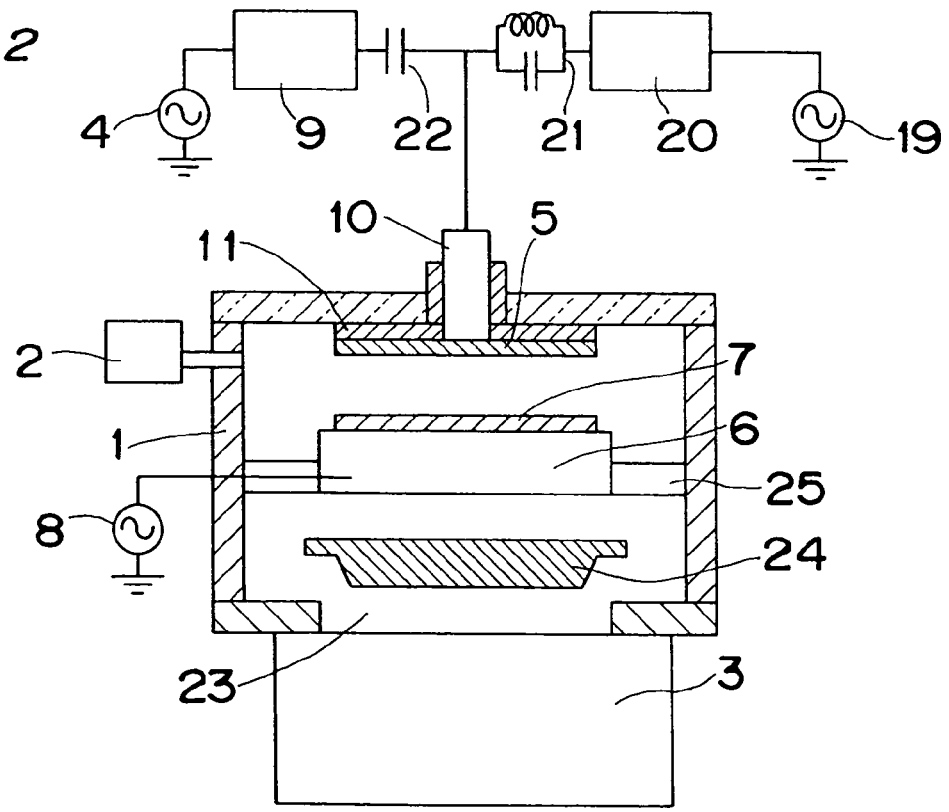
FIG. 2 is a sectional view showing a construction of a plasma processing apparatus used in a second embodiment of the present invention.
Figure 3:
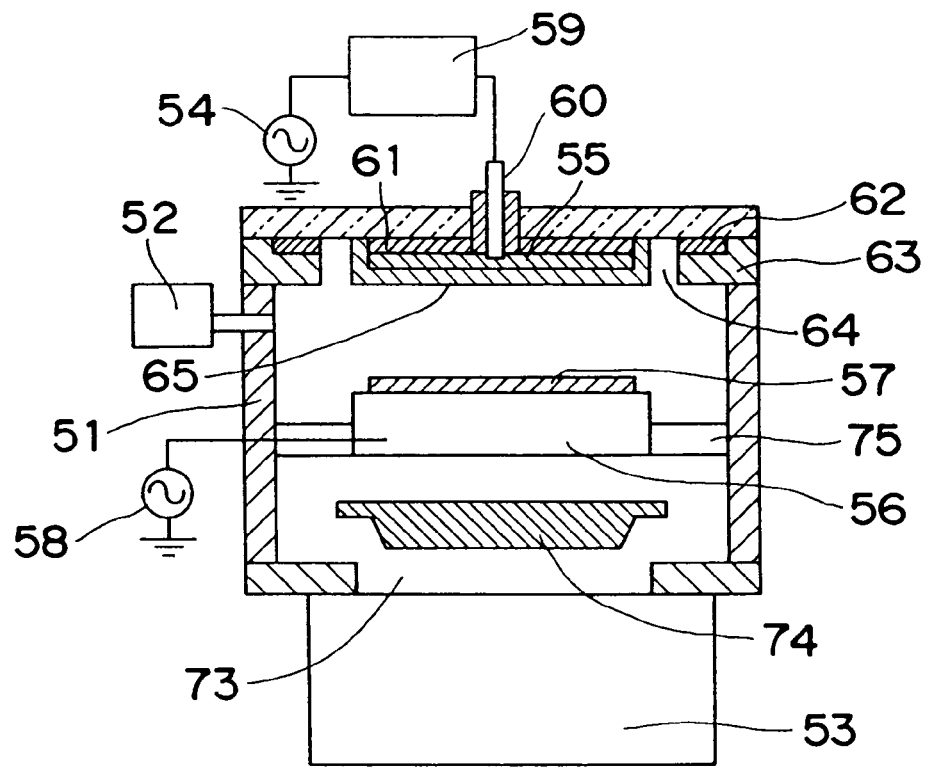
FIG. 3 is a sectional view showing a construction of a plasma processing apparatus used in a prior-art example.

A case where a plasma processing method and apparatus according to a second embodiment of the present invention having such a constitution as shown in FIG. 2 in which no antenna cover is used is also within the application range of the present invention. Referring to FIG. 2, while interior of a vacuum vessel 1 is maintained at a specified pressure by introducing a specified gas from a gas supply unit 2 into the vacuum vessel 1 serving as one example of a vacuum chamber and simultaneously performing exhaustion by a turbo-molecular pump 3 as an exhausting unit, a high-frequency power of a 100 MHz frequency is supplied by an antenna use high-frequency power supply 4 to an antenna 5. As a result of this, plasma is generated in the vacuum vessel 1, allowing plasma processing to be carried out on a substrate 7 placed on a substrate electrode 6. There is also provided a substrate-electrode use high-frequency power supply 8 for supplying high-frequency power of 400 kHz to the substrate electrode 6, making it possible to control ion energy that reaches the substrate 7. The high-frequency power supplied to the antenna 5 is fed to a proximity of the center of the antenna 5 by a feed bar 10 via an antenna-use matching circuit 9. A dielectric plate 11 constructed of a dielectric material is sandwiched between the antenna 5 and the vacuum vessel 1, and the feed bar 10 extends through a through hole provided in the dielectric plate 11.

A high-frequency power of a 500 kHz frequency is supplied to the antenna 5 from a self-bias generation use high-frequency power supply 19 via a self-bias use matching circuit 20. A 100 MHz trap (trap circuit) 21 is provided to prevent the high-frequency power of a 100 MHz frequency for use of plasma generation from mixing into the self-bias use matching circuit 20, and further, a high-pass filter 22 is provided to prevent the 500 kHz high-frequency power from mixing into the antenna-use matching circuit 9 for use of plasma generation.

The turbo-molecular pump 3 and an exhaust port 23 are disposed just under the substrate electrode 6, and a pressure-regulating valve 24 for controlling the vacuum vessel 1 to a specified pressure is an up-and-down valve disposed just under the substrate electrode 6 and just over the turbo-molecular pump 3. The substrate electrode 6 is fixed to the vacuum vessel 1 with four pillars 25.

Also with the plasma processing apparatus shown in FIG. 2, the deposition of conductive deposited film on the antenna can effectively be prevented in the etching process of high melting metal.

As apparent from the above description, according to the plasma processing method in the first aspect of the present invention, there is provided the plasma processing method in which the substrate is placed on the substrate electrode within the vacuum vessel, and the plasma is generated by supplying the high-frequency power of a 30 MHz to 3 GHz frequency to the antenna provided in opposition to the substrate electrode while interior of the vacuum vessel is controlled to the specified pressure by supplying gas into the vacuum vessel and simultaneously exhausting the interior of the vacuum vessel and thus etching is performed on the high melting metal film formed on the substrate, wherein the substrate is processed wall which a high-frequency power of a 100 kHz to 20 MHz frequency different from the above frequency is additionally supplied to the antenna. Therefore, the plasma processing method which is less liable to occurrence of dust can be provided.

Also, according to the plasma processing method in the third aspect of the present invention, there is provided the plasma processing method in which the substrate is placed on the substrate electrode within the vacuum vessel, and the plasma is generated by supplying the high-frequency power of a 30 MHz to 3 GHz frequency to the antenna provided in opposition to the substrate electrode and covered with the insulating antenna cover while interior of the vacuum vessel is controlled to the specified pressure by supplying gas into the vacuum vessel and simultaneously exhausting the interior of the vacuum vessel and thus the substrate is processed, wherein the substrate is processed with temperature of the antenna controlled by giving a flow of the refrigerant to the antenna while ensuring heat conduction between the antenna and the antenna cover by the electrically conductive sheet which is disposed between the antenna and the antenna cover and whose surface parallel to the substrate is larger in size than the antenna, and further the substrate is processed while the self-bias voltage is generated up to an end portion of the cover by additionally supplying the high-frequency power of the 100 kHz to 20 MHz frequency different from the above frequency to the antenna. Therefore, the plasma processing method which is less liable to occurrence of dust and cracks of the antenna cover can be provided.

Also, according to the plasma processing apparatus in the sixth aspect of the present invention, there is provided the plasma processing apparatus comprising: the vacuum vessel; the gas supply unit for supplying gas into the vacuum vessel; the exhausting unit for exhausting interior of the vacuum vessel; the pressure-regulating valve for controlling the interior of the vacuum vessel to the specified pressure; the substrate electrode for placing thereon the substrate within the vacuum vessel; the antenna provided in opposition to the substrate electrode and covered with the insulating antenna cover; the high-frequency power supply capable of supplying the high-frequency power of the 30 MHz to 3 GHz frequency to the antenna; the high-frequency power supply capable of additionally supplying the high-frequency power of the 100 kHz to 20 MHz frequency different from the above frequency to the antenna; and the refrigerant supply unit for making the refrigerant flow to the antenna, wherein the electrically conductive sheet whose surface parallel to the substrate is larger in size than the antenna and which is provided between the antenna and the antenna cover. Therefore, the plasma processing apparatus which is less liable to occurrence of dust and cracks of the antenna cover can be provided.

Next, an object of plasma processing methods and apparatuses according to third to eighth embodiments of the present invention is to provide a plasma processing method and apparatus which is less liable to occurrence of dust and capable of obtaining a stable etching rate.

Figure 10:
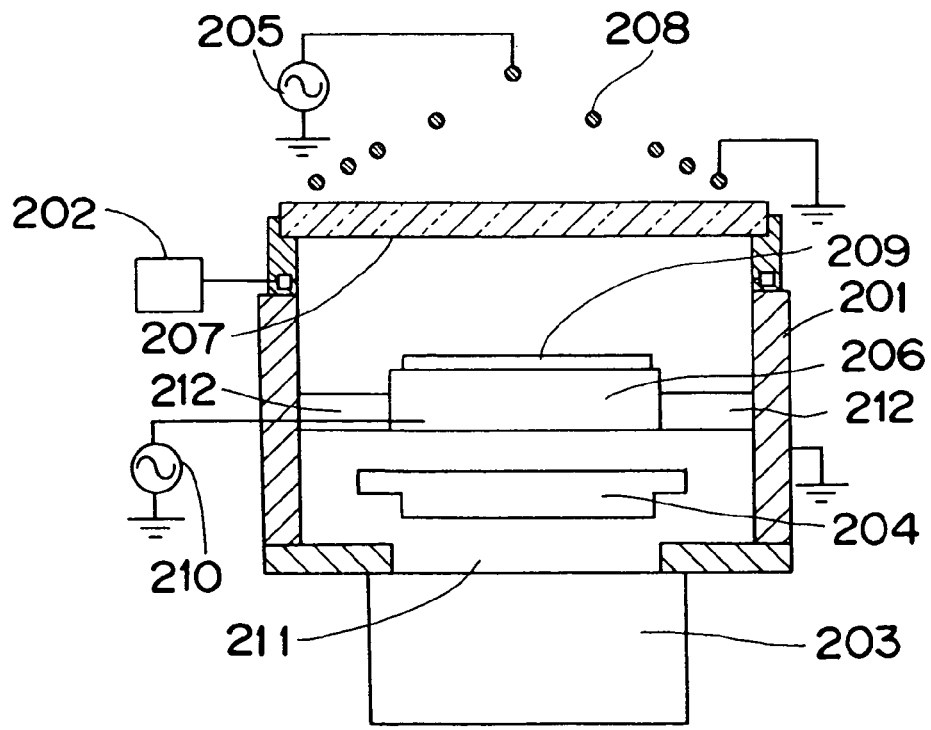
FIG. 10 is a sectional view showing a construction of a plasma processing apparatus used in a prior-art example.

First of all, plasma processing using an inductive-coupling type plasma source is described below as an example of prior-art plasma processing methods with reference to FIG. 10. Referring to FIG. 10, while interior of a vacuum vessel 201 is maintained to a specified pressure with a pressure-regulating valve 204 by introducing a specified gas from a gas supply unit 202 into the vacuum vessel 201 and simultaneously performing exhaustion by a turbo-molecular pump 203 as an exhausting unit, a high-frequency power of 13.56 MHz is supplied by a coil use high-frequency power supply 205 to a coil 208 provided along a dielectric plate 207 opposed to a substrate electrode 206. Then, inductive-coupling type plasma is generated in the vacuum vessel 201, allowing plasma processing to be carried out on a substrate 209 placed on the substrate electrode 206. There is also provided a substrate-electrode use high-frequency power supply 210 for supplying a high-frequency power to the substrate electrode 206, making it possible to control ion energy that reaches the substrate 209. The turbo-molecular pump 203 and an exhaust port 211 are disposed just under the substrate electrode 206, and the pressure-regulating valve 204 is an up-and-down valve disposed just under the substrate electrode 206 and just over the turbo-molecular pump 203. The substrate electrode 206 is fixed to the vacuum vessel 201 with four pillars 212.

In the plasma processing described in the prior-art example, however, there has been an issue that a deposited film caused by reaction is more likely to be deposited onto the inner wall surface of the dielectric plate 207 during continued process. In particular, etching a high melting metal film formed on the substrate 209 would involve deposition of an electrically conductive deposited film on the dielectric plate 207, in which case poor close-contactability of the conductive deposited film or occurrence of abnormal discharge at the surface of the dielectric plate 207 would make it more likely to occur that the conductive deposited film would be peeled off, falling onto the substrate 209 as dust in some cases. According to a result of our experiments, when the substrate 209 coated with a 200 nm thick iridium film was etched to a quantity of 50 pieces, 1000 or more dust particles having 0.23 µm or larger particle diameters were generated on the substrate 209.

Further, in the plasma processing described in the prior-art example, there is another issue that continued etching of the substrate 209 with an iridium film would cause a conductive deposited film to be deposited onto the dielectric plate 207 so that the conductive deposited film makes a shielding against the high-frequency electromagnetic field generated from the coil 208, causing an induction field formed within the vacuum vessel 201 to be weakened, with a result of lowered plasma density and, therefore, lowered etching rate. According to a result of our experiments, as a result of etching the substrate 209 coated with a 200 nm thick iridium film to a quantity of 50 pieces, whereas the initial etching rate was 102 nm/min., the etching rate after a 50-piece etching process lowered to 81 nm/min.

Accordingly, the plasma processing methods and apparatuses according to the third to eighth embodiments of the present invention are intended to provide plasma processing methods and apparatuses which are less liable to occurrence of dust and capable of obtaining a stable etching rate.

First, the third embodiment of the present invention is described below with reference to FIG. 4.

Figure 4:
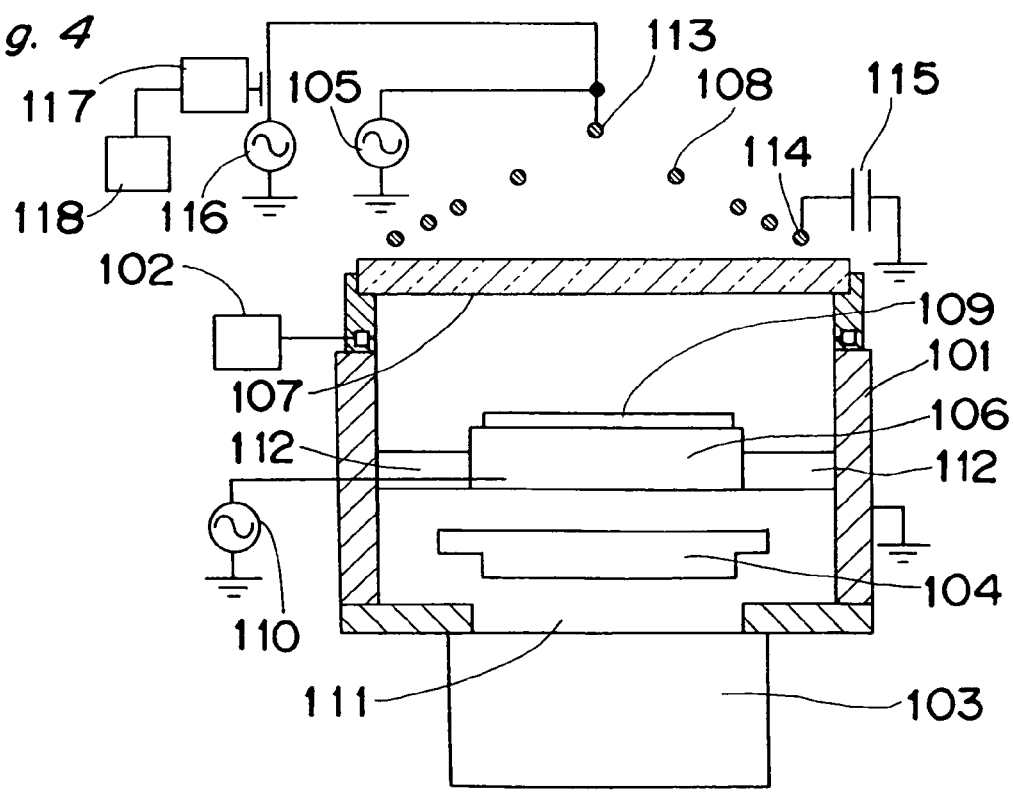
FIG. 4 is a sectional view showing a construction of a plasma processing apparatus used in a third embodiment of the present invention.

FIG. 4 is a sectional view of a plasma processing apparatus with an inductive-coupling type plasma source mounted thereon, which is used in the third embodiment of the present invention. Referring to FIG. 4, while interior of a vacuum vessel 101 is maintained to a specified pressure with a pressure-regulating valve 104 by introducing a specified gas from a gas supply unit 102 into the vacuum vessel 101 serving as one example of a vacuum chamber and simultaneously performing exhaustion by a turbo-molecular pump 103 as an exhausting unit, a first high-frequency power of 13.56 MHz is supplied by a coil-use first high-frequency power supply 105 to a coil 108 provided along a dielectric plate 107 opposed to a substrate electrode 106. Then, inductive-coupling type plasma is generated in the vacuum vessel 101, allowing plasma processing to be carried out on a substrate 109 placed on the substrate electrode 106 or on a film formed on the substrate 109. There is also provided a substrate-electrode use high-frequency power supply 110 for supplying a high-frequency power to the substrate electrode 106, making it possible to control ion energy that reaches the substrate 109. The turbo-molecular pump 103 and an exhaust port 111 are disposed just under the substrate electrode 106, and the pressure-regulating valve 104 is an up-and-down valve disposed just under the substrate electrode 106 and just over the turbo-molecular pump 103. The substrate electrode 106 is fixed to the vacuum vessel 101 with four pillars 112.

A feeding point 113, which is one end of the coil 108, is located at the center of a spiral formed by the coil 108. The other end 114 of the coil 108 is grounded via a capacitor 115. The capacitor 115 has a capacity of 1000 pF. Further, a coil-use second high-frequency power supply 116 for supplying a second high-frequency power of a 500 kHz frequency, lower than 13.56 MHz of the first high-frequency power, to the coil 108 is provided and connected to the feeding point 113 of the coil 108.

Also, a band-pass filter 117 is provided as a circuit for preventing any influences of modulation by the second high-frequency power from being exerted on the detection circuit system for reflected waves of the first high-frequency power. This is intended to eliminate any effects of fluctuations of the sheath thickness of the surface of the dielectric plate 107 by 500 kHz due to the supply of the second high-frequency power and to thereby take out and detect only the 13.56 MHz component out of the reflected waves of the first high-frequency power. In such an arrangement, carrying out processes while monitoring the reflected waves of the first high-frequency power by a reflected-wave meter 118 makes it possible to detect any trouble with the matching state or the coil-use first high-frequency power supply in real time. In addition, assuming that the frequency of the first high-frequency power is $f_1$ and the frequency of the second high-frequency power is $f_2$, the band-pass filter 117 preferably has such frequency characteristics that its center frequency is set to a proximity of $f_1$ and that its damping factor is 10 dB or more at $f_1 \pm f_2$.

With the plasma processing apparatus of the above-described constitution, as one example, the substrate 109 coated with a 200 nm thick iridium film was etched to a quantity of 50 pieces under the conditions that while the internal pressure of the vacuum vessel 101 was maintained to 0.5 Pa by supplying 145 sccm of argon gas and 15 sccm of chlorine gas into the vacuum vessel 101, 1500 W of the first high-frequency power and 500 W of the second high-frequency power were supplied to the coil 108, and simultaneously 400 W of a 400 kHz high-frequency power was supplied to the substrate electrode 106. As a result of this, only 50 or less dust particles having 0.23 μm or larger particle diameters were generated on the substrate 109, which led to a dramatic improvement over the prior art in terms of the quantity of substrates that can be continuously processed without performing wet maintenance of the vacuum vessel 101. Also, whereas the initial etching rate was 102 nm/min., the etching rate after a 50-piece etching process lowered to 101 nm/min., thus freeing from occurrence of such lowering of etching rate as would be seen in the prior art.

This can be attributed to the fact that an ion bombardment was generated on the surface of the dielectric plate 107 as a result of capacitively coupling the coil 108 and plasma together, making it possible to effectively prevent the deposition of any conductive deposited film on the dielectric plate 107. In fact, examining the surface state of the dielectric plate 107 after a 50-piece etching process of the substrate 109 coated with an iridium film showed no formation of any conductive deposited film.

The above-described embodiment of the present invention has exemplified only a part of many variations on configuration of the vacuum vessel, structure and arrangement of the plasma source, and the like out of the application range of the present invention. Needless to say, other many variations are conceivable in applying the present invention, other than the example given above.

Figure 5:
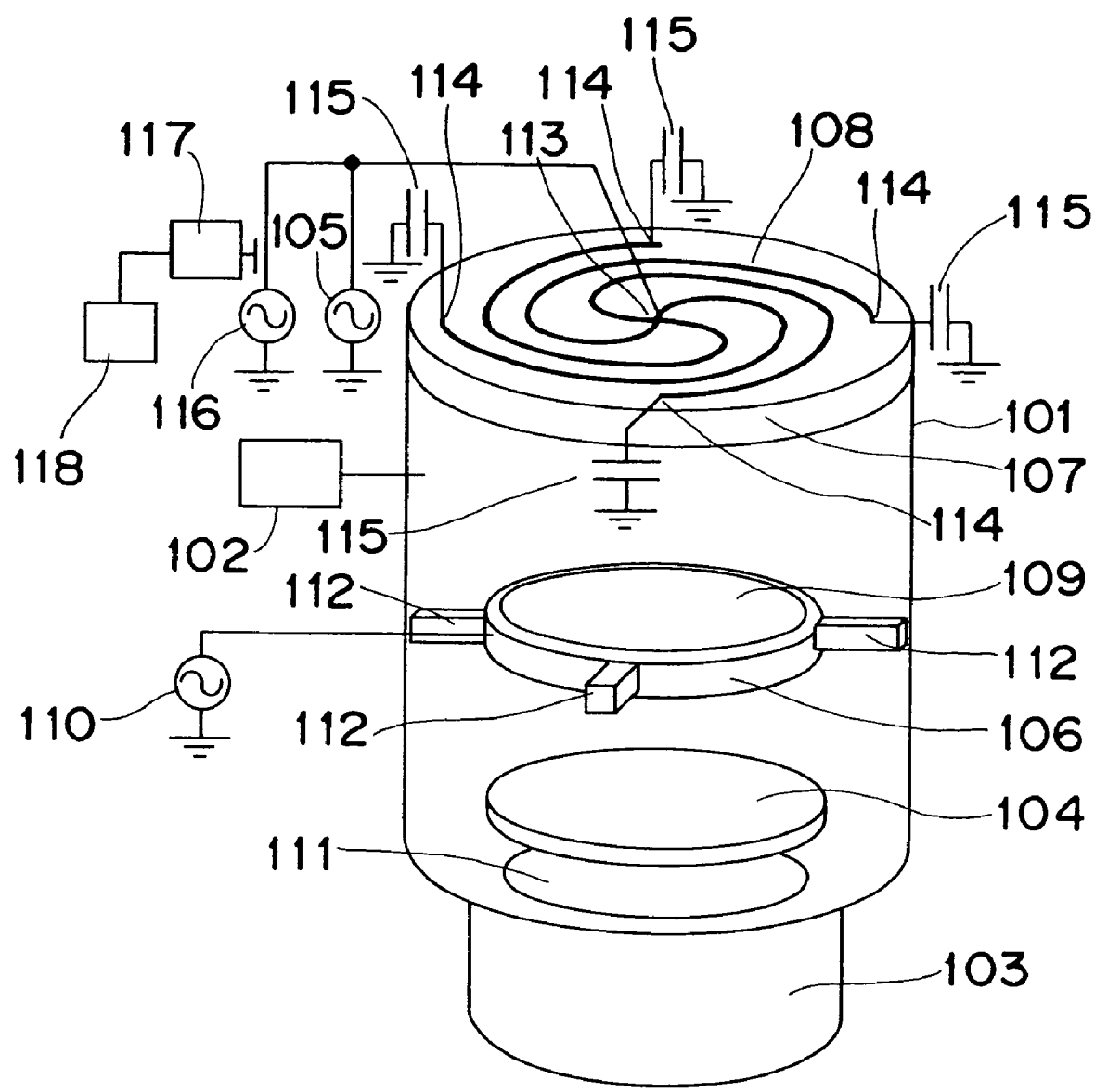
Figure 6:
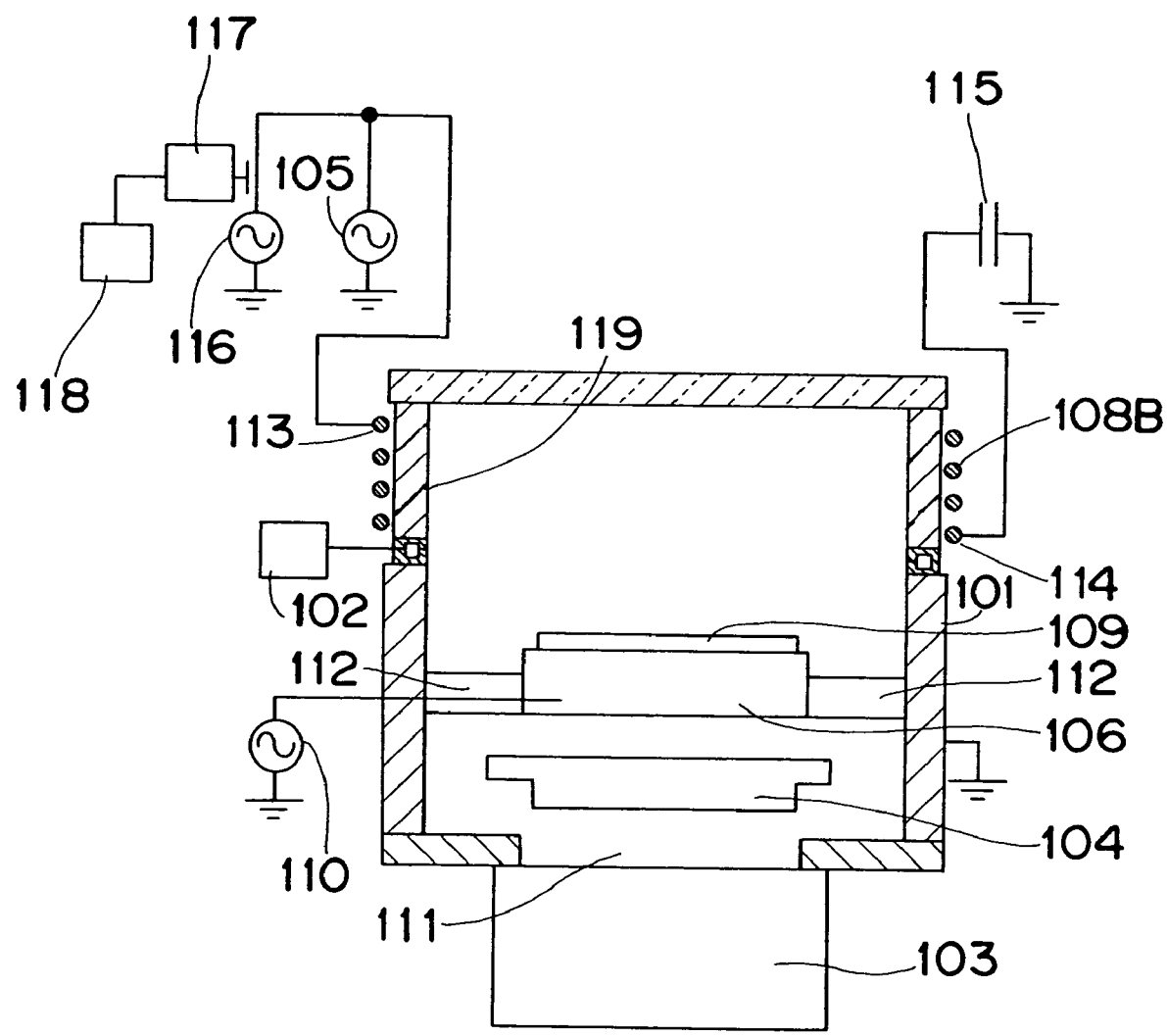
FIG. 6 is a sectional view showing a construction of a plasma processing apparatus used in a fifth embodiment of the present invention.

For example, as shown in the fourth embodiment of the present invention in FIG. 5, the coil 108 may also be of a multiple spiral type. In this case, the coil 108 is low in inductance, having an advantage that a good matching state can more easily be obtained for high frequencies or large-scale coils. Further, as shown in the fifth embodiment of the present invention in FIG. 6, the coil 108B may be of a cylindrical type. In this case, a dielectric cylinder 119 is used in place of the dielectric plate.

The above-described third embodiment of the present invention has been exemplified by a case where the frequency of the first high-frequency power is 13.56 MHz and the frequency of the second high-frequency power is 500 kHz. However, it is considered preferable that the frequency of the second high-frequency power is not more than 1/10 of the frequency of the first high-frequency power. In the third embodiment of the present invention, since the capacity of the capacitor 115 is 1000 pF, the impedance of the capacitor for the first high-frequency power is $$1/(2\pi \times 13.56 \times 10^6 \times 1000 \times 10^{-12}) = 12 \ \Omega.$$

For the second high-frequency power, on the other hand, the impedance is $$1/(2\pi \times 500 \times 10^3 \times 1000 \times 10^{-12}) = 320 \ \Omega.$$

Since the inductance of the coil 108 was 0.8 μH, the impedance of the coil 108 for the first high-frequency power is $$2\pi \times 13.56 \times 10^6 \times 0.8 \times 10^{-6} = 68 \ \Omega.$$

For the second high-frequency power, on the other hand, the impedance is $$2\pi \times 500 \times 10^3 \times 0.8 \times 10^{-6} = 2.5 \ \Omega.$$

Therefore, the ratio of a voltage applied to the coil 108 to a voltage applied to the capacitor 115 for the first high-frequency power is $$68 \div 12 = 5.7,$$

and for the second high-frequency power, it is 2.5÷320=0.0078.

Therefore, it can be understood that a series circuit of the coil 108 and the capacitor 115 is nearly inductive (coil component) as viewed from the first high-frequency power, and nearly capacitive (capacitor component) as viewed from the second high-frequency power. That is, while inductive-coupling type plasma is generated with the first high-frequency power, the coil 108 and the plasma can be capacitively coupled together with the second high-frequency power so that an ion bombardment due to the self-bias voltage can be given to the surface of the dielectric plate 107 or the dielectric cylinder 119. It can be considered that such a relationship holds when the frequency of the second high-frequency power is not more than generally $\frac{1}{10}$ of the frequency of the first high-frequency power. If the frequency of the second high-frequency power is larger than $\frac{1}{10}$ of the frequency of the first high-frequency power, the difference in the ratio of the voltage applied to the coil 108 to the voltage applied to the capacitor 115 between the first high-frequency power and the second high-frequency power would be too small, making it hard to expect the intended effect.

Even in the prior-art example, since the high-frequency voltage is relatively large in vicinities of the center of the coil 108, there would occur some degree of ion bombardment due to the self-bias voltage in vicinities of the center of the dielectric plate 107. However, since the high-frequency voltage is low in vicinities of the outer periphery of the coil 108, there would occur almost no ion bombardment due to the self-bias voltage in vicinities of the outer periphery of the dielectric plate 107. Further, the present invention has an advantage that plasma density is controlled by the magnitude of the first high-frequency power and, independently of this, the ion bombardment can be controlled by the magnitude of the second high-frequency power.

Also, if the impedance of the coil against the first high-frequency power is not less than a double of the impedance of the capacitor and the impedance of the coil against the second high-frequency power is not more than ⅕ of the impedance of the capacitor, then enough difference in the ratio of the voltage applied to the coil 108 to the voltage applied to the capacitor 115 between the first high-frequency power and the second high-frequency power can be obtained, which is considered effective. When these conditions are not satisfied, there would result too small a difference in the ratio of the voltage applied to the coil 108 to the voltage applied to the capacitor 115 between the first high-frequency power and the second high-frequency power, making it hard to expect the intended effect. In addition, when multiple coils are used as in the fourth embodiment of the present invention, it is appropriate that the impedance be considered for each one pair of coil and capacitor.

Also, if the impedance of the capacitor against the first high-frequency power is not more than 25 Ω and the impedance of the capacitor against the second high-frequency power is not less than 250 Ω, then enough difference in the ratio of the voltage applied to the coil 108 to the voltage applied to the capacitor 115 between the first high-frequency power and the second high-frequency power can be obtained, which is considered effective. When these conditions are not satisfied, there would result too small a difference in the ratio of the voltage applied to the coil 108 to the voltage applied to the capacitor 115 between the first high-frequency power and the second high-frequency power, making it hard to expect the intended effect. In addition, when multiple coils are used as in the fourth embodiment of the present invention, it is appropriate that the impedance be considered for each one pair of coil and capacitor.

Also, if the impedance of the coil against the first high-frequency power is not less than 50 Ω and the impedance of the coil against the second high-frequency power is not more than 5 Ω, then enough difference in the ratio of the voltage applied to the coil 108 to the voltage applied to the capacitor 115 between the first high-frequency power and the second high-frequency power can be obtained, which is considered effective. When these conditions are not satisfied, there would result too small a difference in the ratio of the voltage applied to the coil 108 to the voltage applied to the capacitor 115 between the first high-frequency power and the second high-frequency power, making it hard to expect the intended effect. In addition, when multiple coils are used as in the fourth embodiment of the present invention, it is appropriate that the impedance be considered for each one pair of coil and capacitor.

Next, a sixth embodiment of the present invention is described with reference to FIG. 7.

Figure 7:
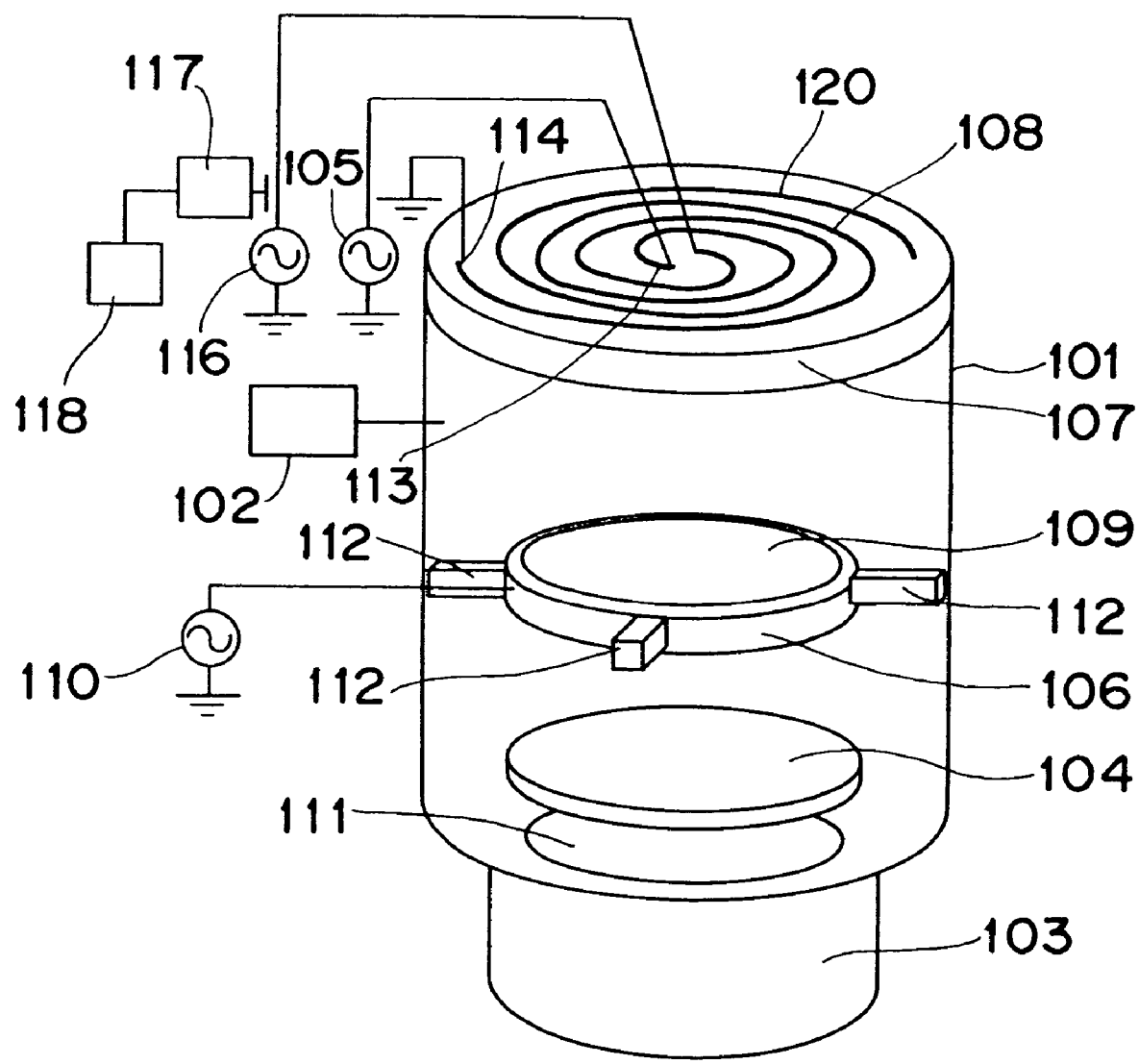

FIG. 7 is a perspective view of a plasma processing apparatus having an inductive-coupling type plasma source mounted thereon, which is used in the sixth embodiment of the present invention. Referring to FIG. 7, while interior of a vacuum vessel 101 is maintained to a specified pressure with a pressure-regulating valve 104 by introducing a specified gas from a gas supply unit 102 into the vacuum vessel 101 and simultaneously performing exhaustion by a turbo-molecular pump 103 as an exhausting unit, a first high-frequency power of 13.56 MHz is supplied by a coil-use first high-frequency power supply 105 to a coil 108 provided along a dielectric plate 107 opposed to a substrate electrode 106. Then, inductive-coupling type plasma is generated in the vacuum vessel 101, allowing plasma processing to be carried out with a substrate 109 placed on the substrate electrode 106 or with a film formed on the substrate 109. There is also provided a substrate-electrode use high-frequency power supply 110 for supplying high-frequency power to the substrate electrode 106, making it possible to control ion energy that reaches the substrate 109. The turbo-molecular pump 103 and an exhaust port 111 are disposed just under the substrate electrode 106, and the pressure-regulating valve 104 is an up-and-down valve disposed just under the substrate electrode 106 and just over the turbo-molecular pump 103. The substrate electrode 106 is fixed to the vacuum vessel 101 with four pillars 112.

A feeding point 1 13, which is one end of the coil 108, is located at the center of a spiral formed by the coil 108. Further, there is provided an electrode-use second high-frequency power supply 116 for supplying a second high-frequency power of a frequency, which is lower than the frequency of the first high-frequency power, to an electrode 120 provided at a vacancy of the coil. Although the second high-frequency power is applied to the center of the spiral formed by the electrode 120 in this embodiment, yet it may also be applied to an outer peripheral end of the spiral and moreover the feeding points do not necessarily need to be end portions. Also, the electrode 120 is not grounded.

Also, a band-pass filter 117 is provided as a circuit for preventing any influences of modulation by the second high-frequency power from being exerted on the detection circuit system for reflected waves of the first high-frequency power. This is intended to eliminate any effects of fluctuations of the sheath thickness of the surface of the dielectric plate 107 by 500 kHz due to the supply of the second high-frequency power and to thereby take out and detect only the 13.56 MHz component out of the reflected waves of the first high-frequency power. In such an arrangement, carrying out processes while monitoring the reflected waves of the first high-frequency power by a reflected-wave meter 118 makes it possible to detect any trouble with the matching state or the coil-use first high-frequency power supply in real time. In addition, assuming that the frequency of the first high-frequency power is $f_1$ and the frequency of the second high-frequency power is $f_2$, the band-pass filter 117 preferably has such frequency characteristics that its center frequency is set to a proximity of $f_1$ and that its damping factor is 10 dB or more at $f_1 \pm f_2$.

With the plasma processing apparatus of the above-described constitution, as one example, the substrate 109 coated with a 200 nm thick iridium film was etched to a quantity of 50 pieces under the conditions that while the internal pressure of the vacuum vessel 101 was maintained to 0.5 Pa by supplying 145 sccm of argon gas and 15 sccm of chlorine gas into the vacuum vessel 101, 1500 W of the first high-frequency power was supplied to the coil 108 and 500 W of the second high-frequency power was supplied to the electrode 120, and simultaneously 400 W of a 400 kHz high-frequency power was supplied to the substrate electrode 106. As a result of this, only 50 or less dust particles having 0.23 µm or larger particle diameters were generated on the substrate 109, which led to a dramatic improvement over the prior art in terms of the quantity of substrates that can be continuously processed without performing wet maintenance of the vacuum vessel 101. Also, whereas the initial etching rate was 98 nm/min., the etching rate after a 50-piece etching process was 97 nm/min., thus freeing from occurrence of such lowering of etching rate as would be seen in the prior art.

This can be attributed to the fact that an ion bombardment was generated on the surface of the dielectric plate 107 as a result of capacitively coupling the electrode 120 and plasma together, making it possible to effectively prevent the deposition of any conductive deposited film on the dielectric plate 107. In fact, examining the surface state of the dielectric plate 107 after a 50-piece etching process of the substrate 109 coated with an iridium film showed no formation of any conductive deposited film.

The above-described embodiment of the present invention has exemplified only a part of many variations on configuration of the vacuum vessel, structure and arrangement of the plasma source, and the like out of the application range of the present invention. Needless to say, other many variations are conceivable in applying the present invention, other than the example given above.

Figure 8:
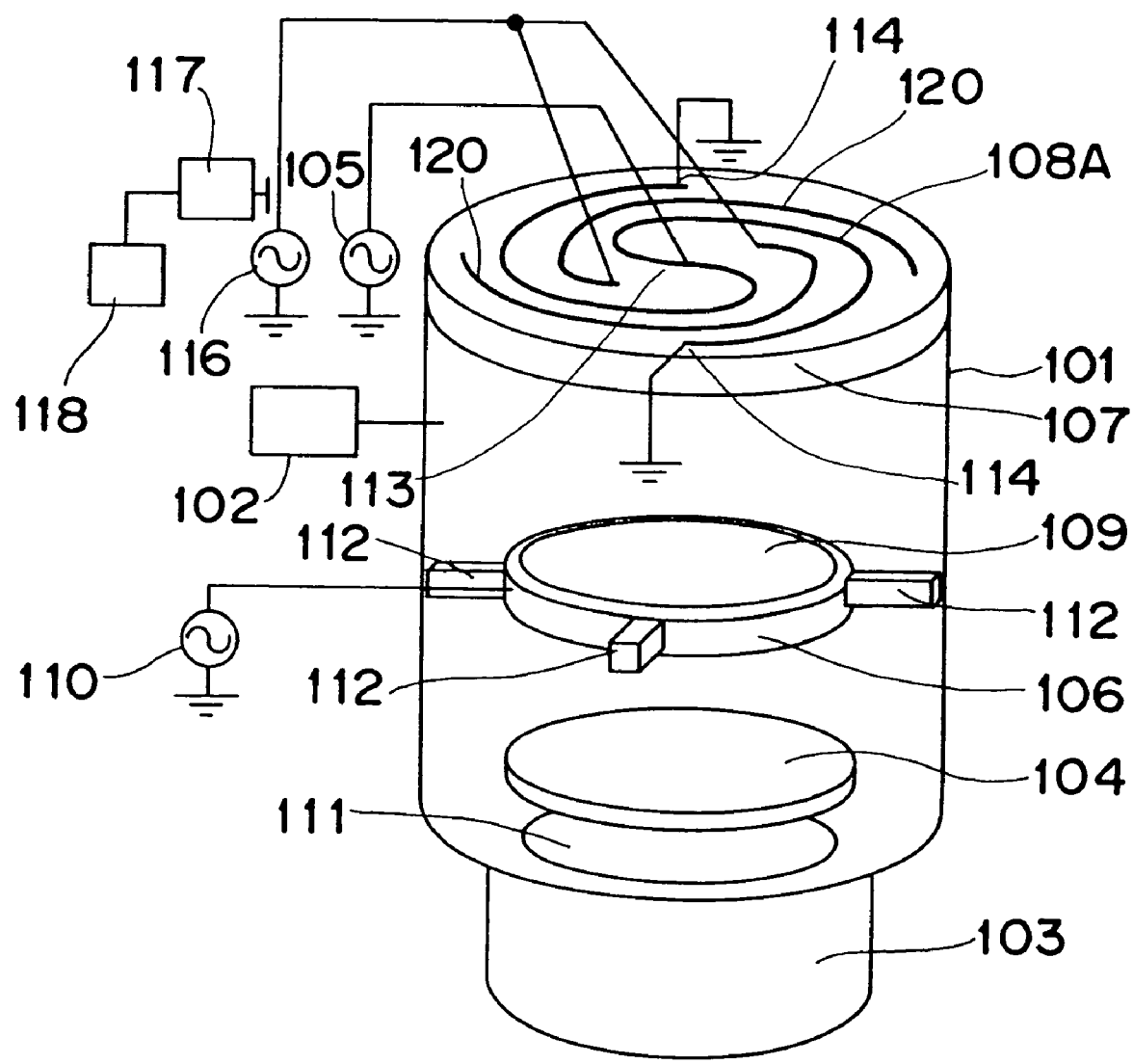
Figure 9:
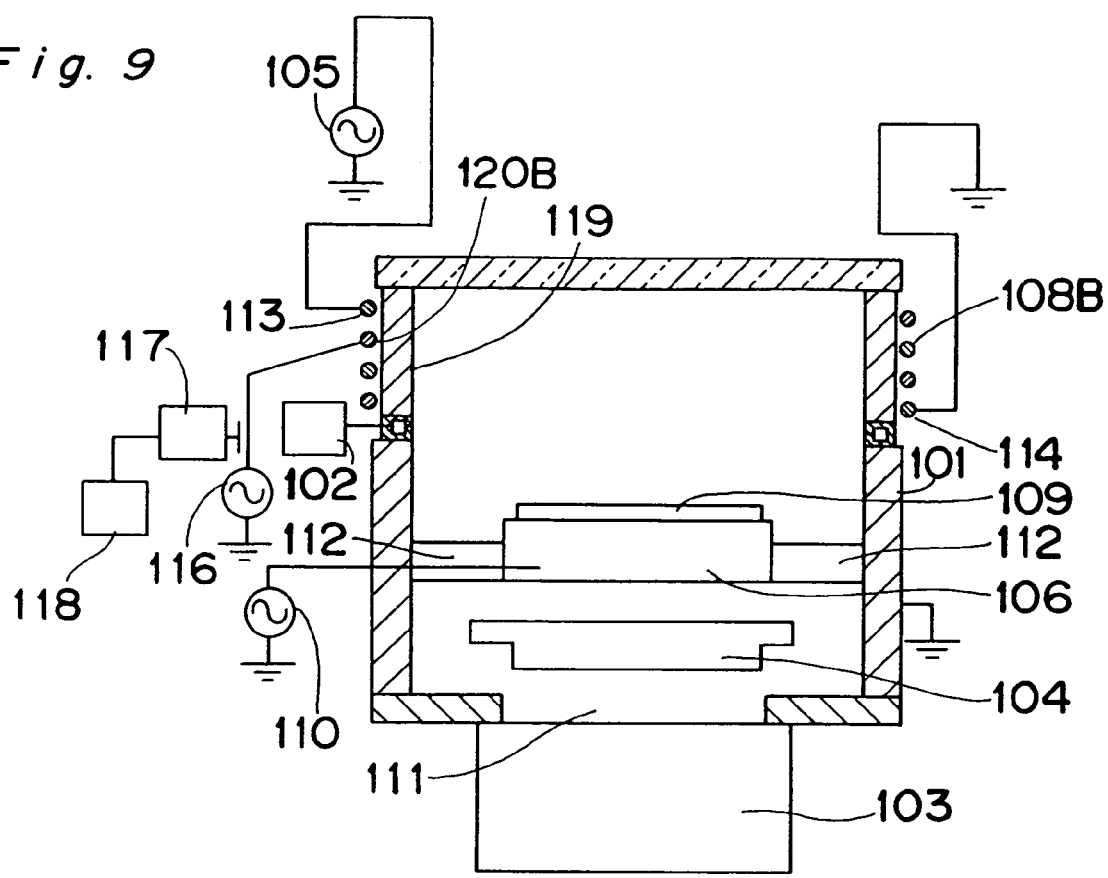
FIG. 9 is a sectional view showing a construction of a plasma processing apparatus used in an eighth embodiment of the present invention.

For example, as shown in the seventh embodiment of the present invention in FIG. 8, the coil 108A may also be of a multiple spiral type. In this case, the coil 108A is low in inductance, having an advantage that a good matching state can more easily be obtained for high frequencies or large-scale coils. In this case, preferably, the electrode 120 is also of a multiple spiral structure as a whole as shown in FIG. 8. Further, as shown in the eighth embodiment of the present invention in FIG. 9, the coil 108B may be of a cylindrical type. In this case, a dielectric cylinder 119 is used in place of the dielectric plate. Further, preferably, the electrode 120B is also of a cylindrical spiral configuration.

The above sixth embodiment of the present invention has been exemplified by a case where the frequency of the high-frequency power is 13.56 MHz and the frequency of the second high-frequency power is 500 kHz. However, it is considered preferable that the frequency of the second high-frequency power is not more than 1/10 of the frequency of the first high-frequency power. With such a relationship, there is an advantage that interference between the first high-frequency power and the second high-frequency power is less likely to occur.

Whereas the above embodiment of the present invention has been exemplified by a case where the plasma processing is an etching of a substrate coated with an iridium film, the present invention is also applicable to other various etching processes and plasma CVD processes. This is because in general there are many cases where the deposition of a deposited film onto the dielectric plate or the dielectric cylinder would matter in etching process or plasma CVD process. However, the present invention is effective particularly for etching of high melting metal films, because the etching process of such films is accompanied by a higher likelihood that a conductive deposited film may be deposited on the dielectric plate or the dielectric cylinder. The high melting metal film is not limited to iridium, and the present invention is particularly effective for the etching process of films containing at least one element selected from among rhodium, ruthenium, platinum, gold, copper, rhenium, bismuth, strontium, barium, zirconium, lead, and niobium.

Also, the above embodiments have been exemplified by a case where the frequency of the first high-frequency power supplied to the coil is 13.56 MHz. However, in order to effectively generate the inductive-coupling type plasma, it is preferable to use frequencies of 1 MHz to 60 MHz. Frequencies lower than 1 MHz would cause a drawback that enough plasma density could not be obtained, while frequencies higher than 60 MHz would cause occurrence of standing waves to the coil, making it quite hard to obtain uniform plasma.

Also, the above embodiments have been exemplified by a case where the frequency of the high-frequency power supplied to the substrate electrode is 400 kHz. However, it is needless to say that high-frequency power of other frequencies, e.g. 100 kHz to 100 MHz, can be used for the control of ion energy that reaches the substrate. Otherwise, without the supply of high-frequency power to the substrate electrode, it is also possible to carry out plasma processing with weak ion energy by making use of a slight difference between plasma potential and substrate potential. Furthermore, as to the frequency of the high-frequency power supplied to the substrate electrode, using a frequency different from the frequency of the second high-frequency power supplied to the coil or the electrode has an advantage that interference of high frequencies can more easily be avoided.

As apparent from the above description, according to the plasma processing method in the 12th aspect of the present invention, there is provided the plasma processing method in which the substrate is placed on the substrate electrode within the vacuum vessel, and the inductive-coupling type plasma is generated in the vacuum vessel by supplying the first high-frequency power of a 1 MHz to 60 MHz frequency to the feeding point which is one end of the coil provided in opposition to the substrate electrode while interior of the vacuum vessel is controlled to the specified pressure by supplying the gas into the vacuum vessel and simultaneously exhausting the interior of the vacuum vessel and thus the substrate or the film formed on the substrate is processed, wherein the substrate is processed while the second high-frequency power of a frequency lower than that of the first high-frequency power is supplied to the coil with the other end of the coil grounded via the capacitor. Therefore, the plasma processing method which is less liable to occurrence of dust and capable of obtaining a stable etching rate can be provided.

Also, according to the plasma processing method in the 13th aspect of the present invention, there is provided the plasma processing method in which the substrate is placed on the substrate electrode within the vacuum vessel, the inductive-coupling type plasma is generated in the vacuum vessel by supplying the first high-frequency power of a 1 MHz to 60 MHz frequency to the feeding point which is one end of the coil provided in opposition to the substrate electrode while interior of the vacuum vessel is controlled to the specified pressure by supplying the gas into the vacuum vessel and simultaneously exhausting the interior of the vacuum vessel, and thus the substrate or the film formed on the substrate is processed, wherein the substrate is processed while the second high-frequency power of a frequency lower than that of the first high-frequency power is supplied to the electrode provided at the vacancy of the coil to process the substrate. Therefore, the plasma processing method which is less liable to occurrence of dust and capable of obtaining a stable etching rate can be provided.

Also, according to the plasma processing apparatus in the 16th aspect of the present invention, there is provided the plasma processing apparatus comprising: the vacuum vessel; the gas supply unit for supplying the gas into the vacuum vessel; the exhausting unit for exhausting the interior of the vacuum vessel; the pressure-regulating valve for controlling the interior of the vacuum vessel to the specified pressure; the substrate electrode for placing thereon the substrate within the vacuum vessel; the coil provided in opposition to the substrate electrode; and the first high-frequency power supply for supplying the first high-frequency power of the 1 MHz to 60 MHz frequency to the feeding point which is one end of the coil, wherein the other end of the coil is grounded via the capacitor, and the plasma processing apparatus further comprises the second high-frequency power supply for supplying the second high-frequency power of a frequency lower than that of the first high-frequency power to the coil. Therefore, the plasma processing apparatus which is less liable to occurrence of dust and capable of obtaining a stable etching rate can be provided.

Also, according to the plasma processing apparatus in the 17th aspect of the present invention, there is provided the plasma processing apparatus comprising: the vacuum vessel; the gas supply unit for supplying the gas into the vacuum vessel; the exhausting unit for exhausting the interior of the vacuum vessel; the pressure-regulating valve for controlling the interior of the vacuum vessel to the specified pressure; the substrate electrode for placing thereon the substrate within the vacuum vessel; the coil provided in opposition to the substrate electrode; the first high-frequency power supply for supplying the first high-frequency power of a 1 MHz to 60 MHz frequency to the feeding point which is one end of the coil, wherein the plasma processing apparatus further comprises the second high-frequency power supply for supplying the second high-frequency power of a frequency lower than that of the first high-frequency power to the electrode provided at the vacancy of the coil. Therefore, the plasma processing apparatus which is less liable to occurrence of dust and capable of obtaining a stable etching rate can be provided.

In addition, combining any arbitrary embodiments together appropriately from among the foregoing various embodiments allows their respective effects to be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method for generating inductive-coupling type plasma in a vacuum vessel, the method comprising:
    placing a substrate on a substrate electrode within the vacuum vessel;
    supplying a first high-frequency power of a 1 MHz to 60 MHz frequency to a feeding point which is one end of a coil provided in opposition to the substrate electrode while an interior of the vacuum vessel is controlled to a specified pressure by supplying gas into the vacuum vessel and simultaneously exhausting the interior of the vacuum vessel, and thus processing the substrate or a film formed on the substrate; and
    supplying a second high-frequency power of a frequency, which is lower than that of the first high-frequency power, to the coil with the other end of the coil grounded via a capacitor,
    wherein the first high-frequency power and the second high-frequency power are directly applied to the coil.

2. The plasma processing method according to claim 1, wherein an impedance of the coil against the first high-frequency power is not less than the double of an impedance of the capacitor, and wherein an impedance of the coil against the second high-frequency power is not more than ⅕ of the impedance of the capacitor.

3. The plasma processing method according to claim 1, wherein the plasma processing is an etching process of a metal film formed on the substrate.

4. The plasma processing method according to claim 3, wherein the metal film is a film containing at least one element selected from among iridium, rhodium, ruthenium, platinum, gold, copper, rhenium, bismuth, strontium, barium, zirconium, lead, and niobium.

5. The plasma processing method according to claim 3, wherein an impedance of the coil against the first high-frequency power is not less than the double of an impedance of the capacitor, and wherein an impedance of the coil against the second high-frequency power is not more than ⅕ of the impedance of the capacitor.

6. A plasma processing method for generating inductive-coupling type plasma in a vacuum vessel, the method comprising:
    placing a substrate on a substrate electrode within the vacuum vessel;
    supplying a first high-frequency power of a 1 MHz to 60 MHz frequency to a feeding point which is one end of a coil provided in opposition to the substrate electrode while an interior of the vacuum vessel is controlled to a specified pressure by supplying gas into the vacuum vessel and simultaneously exhausting the interior of the vacuum vessel, and thus processing the substrate or a film formed on the substrate; and
    supplying a second high-frequency power of a frequency, which is lower than that of the first high-frequency power, to an electrode provided at a gap defined between wires forming the coil,
    wherein the first high-frequency power is directly applied to the coil.

* * * * *